United States Patent
Xu

(10) Patent No.: US 10,570,744 B2
(45) Date of Patent: Feb. 25, 2020

(54) METHOD FOR FORMING COMPONENTS USING ADDITIVE MANUFACTURING AND RE-MELT

(71) Applicant: United Technologies Corporation, Farmington, CT (US)

(72) Inventor: JinQuan Xu, East Greenwich, RI (US)

(73) Assignee: United Technologies Corporation, Farmington, CT (US)

( * ) Notice: Subject to any disclaimer, the term of this patent is extended or adjusted under 35 U.S.C. 154(b) by 382 days.

(21) Appl. No.: 15/228,543

(22) Filed: Aug. 4, 2016

(65) Prior Publication Data

US 2016/0341045 A1  Nov. 24, 2016

Related U.S. Application Data

(62) Division of application No. 14/706,659, filed on May 7, 2015, now Pat. No. 9,435,211.

(Continued)

(51) Int. Cl.
*B22C 9/10* (2006.01)
*B22C 9/22* (2006.01)
(Continued)

(52) U.S. Cl.
CPC .............. *F01D 5/18* (2013.01); *B22C 9/02* (2013.01); *B22C 9/10* (2013.01); *B22C 9/22* (2013.01); *B22C 9/24* (2013.01); *B22D 19/10* (2013.01); *B22D 21/005* (2013.01); *B22D 23/06* (2013.01); *B22D 25/02* (2013.01); *B22D 27/045* (2013.01); *B22D 29/00* (2013.01); *B22F 3/1055* (2013.01); *B22F 5/007* (2013.01); *B22F 5/04* (2013.01); *B23P 6/007* (2013.01); *B33Y 10/00* (2014.12); *B33Y 80/00* (2014.12); *C22C 19/03* (2013.01); *C22C 19/07* (2013.01); *C22C 38/00* (2013.01);
(Continued)

(58) Field of Classification Search
CPC .... B22C 9/02; B22C 9/10; B22C 9/22; B22C 9/24; B22D 23/06
USPC ............ 164/24, 34, 35, 112–112.2, 516–529
See application file for complete search history.

(56) References Cited

U.S. PATENT DOCUMENTS

| | | | |
|---|---|---|---|
| 4,573,516 A | 3/1986 | Quested et al. | |
| 4,574,451 A | 3/1986 | Smashey et al. | |

(Continued)

FOREIGN PATENT DOCUMENTS

| | | |
|---|---|---|
| EP | 2359959 | 8/2011 |
| EP | 3096911 A1 | 11/2016 |
| JP | H10193036 | 7/1998 |

OTHER PUBLICATIONS

EP office action for EP15167171.6 dated Jun. 6, 2018.
EPO Official Letter dated Feb. 28, 2019 for Application No. 15167171.6.

*Primary Examiner* — Kevin E Yoon
(74) *Attorney, Agent, or Firm* — Getz Balich LLC

(57) ABSTRACT

A method of manufacturing a component includes additively manufacturing a crucible; directionally solidifying a metal material within the crucible; and removing the crucible to reveal the component. A component for a gas turbine engine includes a directionally solidified metal material component, the directionally solidified metal material component having been additively manufactured of a metal material concurrently with a core, the metal material having been remelted and directionally solidified.

2 Claims, 15 Drawing Sheets

Related U.S. Application Data

(60) Provisional application No. 61/991,118, filed on May 9, 2014.

(51) Int. Cl.

| | |
|---|---|
| *F01D 5/18* | (2006.01) |
| *C22C 19/03* | (2006.01) |
| *C22C 19/07* | (2006.01) |
| *C22C 38/00* | (2006.01) |
| *B22D 25/02* | (2006.01) |
| *B22D 29/00* | (2006.01) |
| *C30B 21/02* | (2006.01) |
| *C30B 11/00* | (2006.01) |
| *B22D 19/10* | (2006.01) |
| *B22D 27/04* | (2006.01) |
| *B22F 3/105* | (2006.01) |
| *C30B 29/52* | (2006.01) |
| *B22C 9/02* | (2006.01) |
| *B22F 5/00* | (2006.01) |
| *B22F 5/04* | (2006.01) |
| *F01D 5/14* | (2006.01) |
| *F01D 5/28* | (2006.01) |
| *F01D 5/30* | (2006.01) |
| *F01D 5/34* | (2006.01) |
| *B23P 6/00* | (2006.01) |
| *F01D 5/00* | (2006.01) |
| *F02M 35/10* | (2006.01) |
| *F02M 21/02* | (2006.01) |
| *F04D 29/046* | (2006.01) |
| *F04D 29/056* | (2006.01) |
| *B33Y 10/00* | (2015.01) |
| *B33Y 80/00* | (2015.01) |
| *B22C 9/24* | (2006.01) |
| *B22D 21/00* | (2006.01) |
| *B22D 23/06* | (2006.01) |
| *B23P 15/02* | (2006.01) |
| *B22F 3/24* | (2006.01) |

(52) U.S. Cl.
CPC ............ *C30B 11/00* (2013.01); *C30B 11/002* (2013.01); *C30B 11/003* (2013.01); *C30B 21/02* (2013.01); *C30B 29/52* (2013.01); *F01D 5/005* (2013.01); *F01D 5/14* (2013.01); *F01D 5/186* (2013.01); *F01D 5/187* (2013.01); *F01D 5/28* (2013.01); *F01D 5/284* (2013.01); *F01D 5/3084* (2013.01); *F01D 5/34* (2013.01); *F02M 21/0206* (2013.01); *F02M 35/10334* (2013.01); *F04D 29/0465* (2013.01); *F04D 29/0566* (2013.01); *B22F 2003/248* (2013.01); *B23P 15/02* (2013.01); *F02M 2200/9007* (2013.01); *F05D 2220/32* (2013.01); *F05D 2230/21* (2013.01); *F05D 2230/22* (2013.01); *F05D 2230/30* (2013.01); *F05D 2240/122* (2013.01); *F05D 2240/30* (2013.01); *F05D 2240/304* (2013.01); *F05D 2260/202* (2013.01); *F05D 2300/175* (2013.01); *F05D 2300/20* (2013.01); *F05D 2300/21* (2013.01); *F05D 2300/22* (2013.01); *F05D 2300/606* (2013.01); *F05D 2300/607* (2013.01); *F05D 2300/609* (2013.01); *F05D 2300/6033* (2013.01)

(56) References Cited

U.S. PATENT DOCUMENTS

| | | | |
|---|---|---|---|
| 5,868,194 A | 2/1999 | Horwood | |
| 5,952,018 A | 9/1999 | Beldue et al. | |
| 6,929,054 B2 * | 8/2005 | Beals ................. | B22C 7/02 |
| | | | 164/365 |
| 6,932,145 B2 * | 8/2005 | Frasier ............... | B22C 9/02 |
| | | | 164/122.2 |
| 7,413,001 B2 | 8/2008 | Wang et al. | |
| 8,327,911 B2 * | 12/2012 | Kush ................. | B28B 1/001 |
| | | | 164/132 |
| 2010/0084106 A1 | 4/2010 | Bullied et al. | |
| 2012/0291983 A1 * | 11/2012 | Graham ............. | B22C 9/04 |
| | | | 164/516 |
| 2013/0026338 A1 * | 1/2013 | Castle ................ | B22C 9/04 |
| | | | 249/114.1 |
| 2013/0280091 A1 | 10/2013 | Propheter-Hinckley et al. | |
| 2013/0294901 A1 * | 11/2013 | Mironets ........... | B22D 23/06 |
| | | | 415/182.1 |
| 2015/0321250 A1 | 11/2015 | Xu | |
| 2016/0368046 A1 * | 12/2016 | Collins .............. | B22C 9/04 |

\* cited by examiner

METHOD FOR FORMING COMPONENTS USING ADDITIVE MANUFACTURING AND RE-MELT

This application is a divisional of U.S. patent application Ser. No. 14/706,659 filed May 7, 2015, which claims priority to U.S. Patent Appln. No. 61/991,118 filed May 9, 2014.

BACKGROUND OF THE INVENTION

1. Technical Field

The present disclosure relates to components for a gas turbine engine and, more particularly, to the additive manufacture thereof.

2. Background Information

Gas turbine engines typically include a compressor section to pressurize airflow, a combustor section to burn a hydrocarbon fuel in the presence of the pressurized air, and a turbine section to extract energy from the resultant combustion gases.

In the gas turbine industry, methods for fabricating components with internal passageways, such as blades and vanes within the turbine section, using additive manufacturing invite much attention. Since a component is produced in a continuous process in an additive manufacturing operation, features associated with conventional manufacturing processes such as machining, forging, welding, casting, etc. can be eliminated leading to savings in cost, material, and time.

An inherent feature of metallic components fabricated by additive manufacturing is that the metallic material forming the component has a polycrystalline microstructure. However, for numerous types of turbine components it is preferable to use a metallic material having a single crystal, or a columnar grain microstructure, which microstructure is able to withstand the higher temperatures and stresses typically experienced in the operating environment in a hot gas stream.

SUMMARY

A method of manufacturing a component according to one disclosed non-limiting embodiment of the present disclosure includes additively manufacturing a crucible for forming the component; solidifying a metal material within the crucible to form a metal directionally solidified microstructure within the component; and removing a sacrificial core to reveal the component.

In a further embodiment of the present disclosure, the step of solidifying the metal material includes directionally solidifying the material to have a single crystal microstructure.

In a further embodiment of the present disclosure, the step of solidifying the metal material includes directionally solidifying the material to have a columnar grain microstructure.

In a further embodiment of the present disclosure, the metal material is selected from the group consisting of a nickel based superalloy, cobalt based superalloy, iron based superalloy, and mixtures thereof.

In a further embodiment of the present disclosure, the crucible is additively manufactured of at least one of a ceramic material, a refractory metal alloy, or combinations thereof.

In a further embodiment of the present disclosure, the metal material is a powder.

In a further embodiment of the present disclosure, the crucible includes a core at least partially within a shell, the core at least partially defines at least one internal passageway within the component.

A further embodiment of the present disclosure includes forming the core via additive manufacturing.

A further embodiment of the present disclosure includes forming the shell via additive manufacturing.

In a further embodiment of the present disclosure, the core at least partially defines the internal passageways within the component.

A method of manufacturing a component according to another disclosed non-limiting embodiment of the present disclosure includes additively manufacturing the component of a metal material; additively manufacturing a core at least partially within the component; at least partially encasing the additively manufactured component and additively manufactured core within a shell; melting the additively manufactured component; solidifying the metal material of the additively manufactured component to form a metal directionally solidified microstructure; and removing the shell and the additively manufactured core from the directionally solidified component.

In a further embodiment of the present disclosure, the step of solidifying the metal material includes directionally solidifying the material to have a single crystal microstructure.

In a further embodiment of the present disclosure, the step of solidifying the metal material includes directionally solidifying the material to have a columnar grain microstructure.

In a further embodiment of the present disclosure, the metal material is a powder.

In a further embodiment of the present disclosure, the core at least partially defines at least one internal passageway within the component.

A further embodiment of the present disclosure includes concurrently additively manufacturing the component of a metal material and the core within the component.

In a further embodiment of the present disclosure, the core at least partially defines microchannels within the component.

In a further embodiment of the present disclosure, the microchannels are additively manufactured of a refractory material and the internal passageways are manufactured of a ceramic material.

In a further embodiment of the present disclosure, the additive manufacturing is performed by a multi-powder bed system.

A further embodiment of the present disclosure includes applying a wax material at least partially onto the component.

A further embodiment of the present disclosure includes melting the wax material prior to melting the additively manufactured component.

A further embodiment of the present disclosure includes applying the wax material to an airfoil portion of the component.

A component for a gas turbine engine, according to another disclosed non-limiting embodiment of the present disclosure includes a metal directionally solidified material component, the metal directionally solidified material component having been additively manufactured of a metal material concurrently with a core, the metal material having been remelted and directionally solidified.

In a further embodiment of the present disclosure, the component has a directionally solidified single crystal microstructure.

In a further embodiment of the present disclosure, the component has a directionally solidified columnar grain microstructure.

In a further embodiment of the present disclosure, the metal single crystal material component includes an airfoil.

In a further embodiment of the present disclosure, the metal single crystal material component is a rotor blade.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
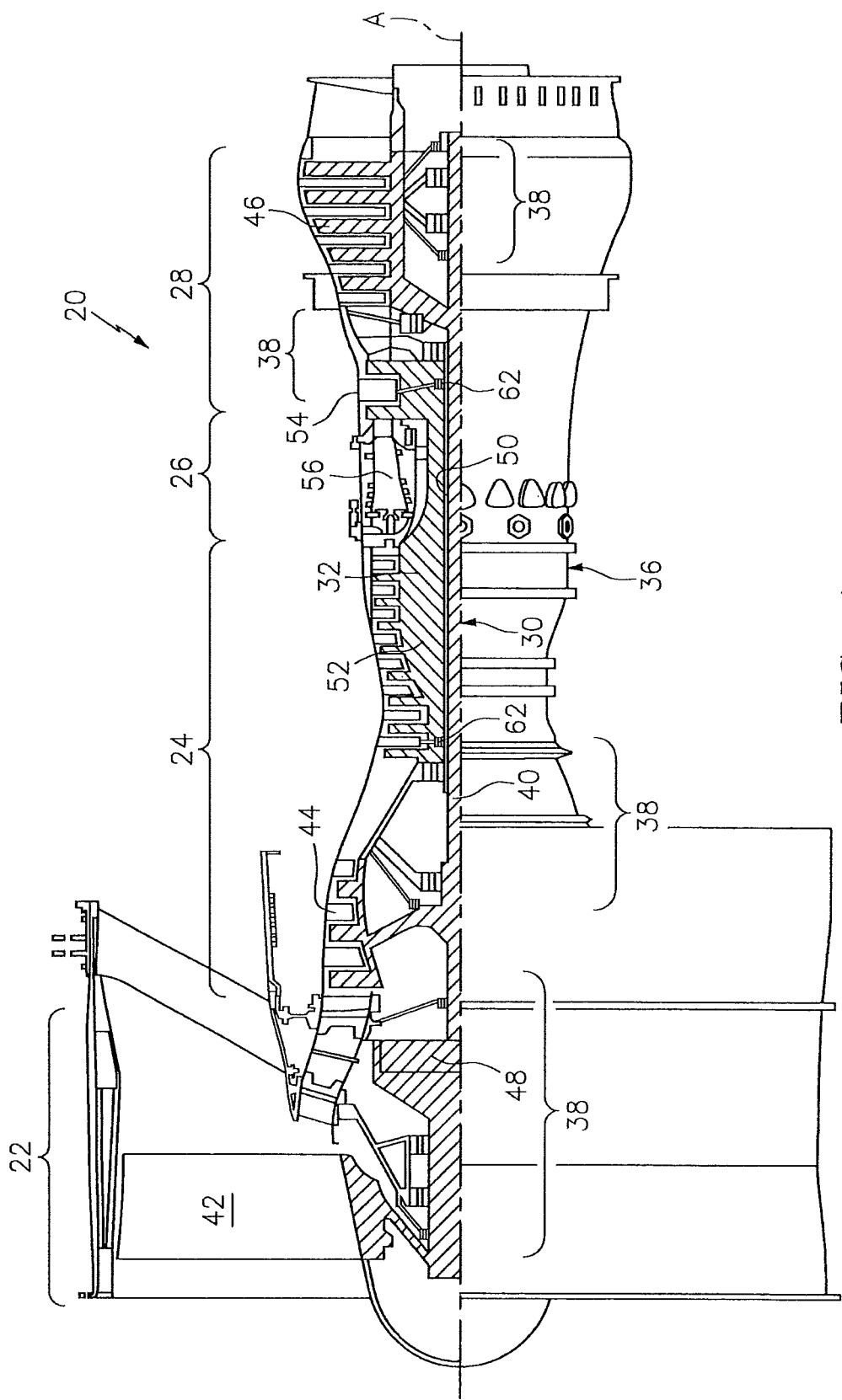
FIG. 1 is a schematic cross-section of an example of gas turbine engine architecture.
Figure 2:
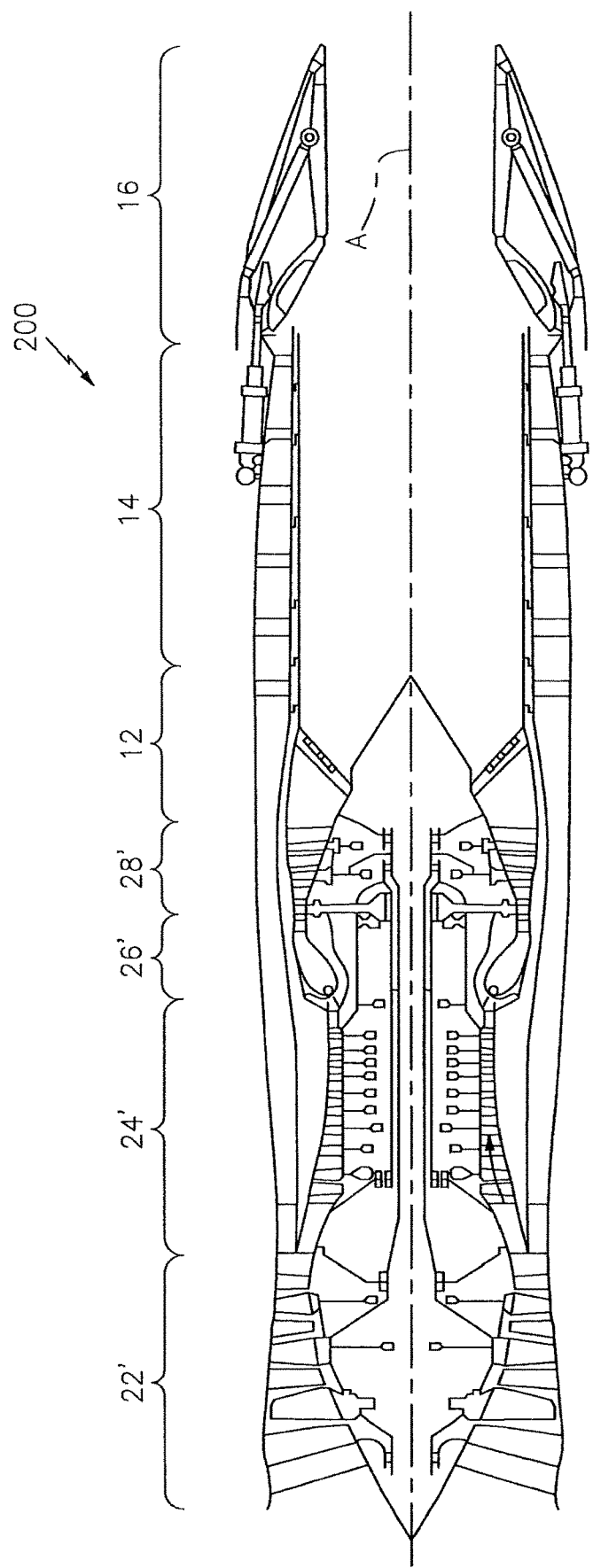
FIG. 2 is a schematic cross-section of another example of gas turbine engine architecture.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. Alternative engine architectures 200 might include an augmentor section 12, an exhaust duct section 14 and a nozzle section 16 (FIG. 2) among other systems or features. The fan section 22 drives air along both a bypass flowpath and into the compressor section 24. The compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbofans as the teachings may be applied to other types of turbine engine architectures such as turbojets, turboshafts, and three-spool (plus fan) turbofans.

The engine 20 generally includes a low spool 30 and a high spool 32 mounted for rotation about an engine central longitudinal axis X relative to an engine static structure 36 via several bearing structures 38. The low spool 30 generally includes an inner shaft 40 that interconnects a fan 42, a low pressure compressor ("LPC") 44 and a low pressure turbine ("LPT") 46. The inner shaft 40 drives the fan 42 directly or through a geared architecture 48 to drive the fan 42 at a lower speed than the low spool 30. An exemplary reduction transmission is an epicyclic transmission, namely a planetary or star gear system.

The high spool 32 includes an outer shaft 50 that interconnects a high pressure compressor ("HPC") 52 and high pressure turbine ("HPT") 54. A combustor 56 is arranged between the high pressure compressor 52 and the high pressure turbine 54. The inner shaft 40 and the outer shaft 50 are concentric and rotate about the engine central longitudinal axis "A" which is collinear with their longitudinal axes.

Core airflow is compressed by the LPC 44 then the HPC 52, mixed with the fuel and burned in the combustor 56, then expanded over the HPT 54 and the LPT 46. The turbines 54, 46 rotationally drive the respective low spool 30 and high spool 32 in response to the expansion. The main engine shafts 40, 50 are supported at a plurality of points by bearing structures 38 within the static structure 36. Bearing structures 38 at various locations may alternatively or additionally be provided.

Figure 3:
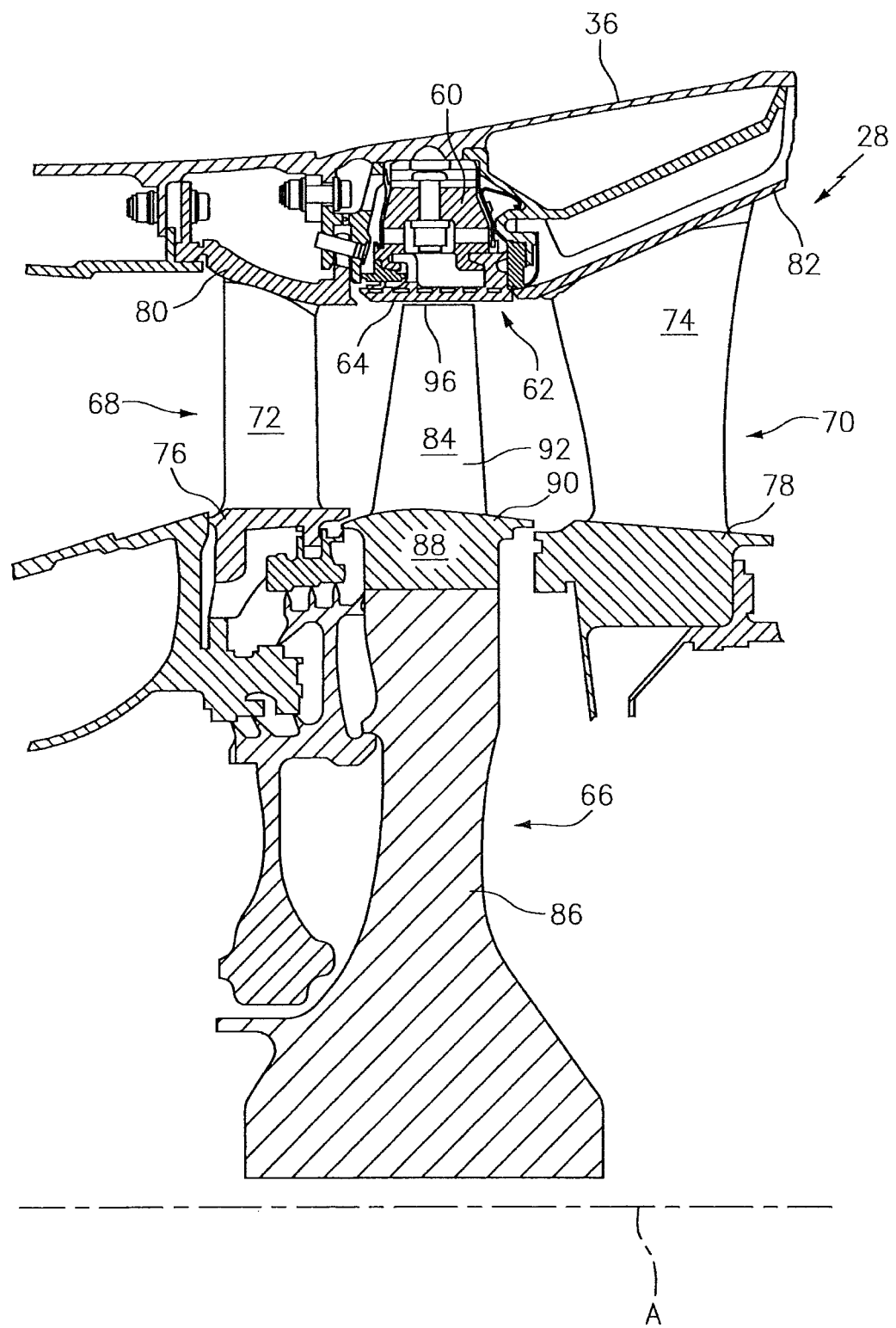
FIG. 3 is an enlarged schematic cross-section of an engine turbine section.

With reference to FIG. 3, an enlarged schematic view of a portion of the turbine section 28 is shown by way of example; however, other engine sections will also benefit here from. A full ring shroud assembly 60 within the engine case structure 36 supports a blade outer air seal (BOAS) assembly 62 with a multiple of BOAS segments 64 proximate to a rotor assembly 66 (one schematically shown).

The full ring shroud assembly 60 and the blade outer air seal (BOAS) assembly 62 are axially disposed between a forward stationary vane ring 68 and an aft stationary vane ring 70. Each vane ring 68, 70 includes an array of vanes 72, 74 that extend between a respective inner vane support 76, 78 and an outer vane support 80, 82. The outer vane supports 80, 82 are attached to the engine case structure 36.

Figure 4:
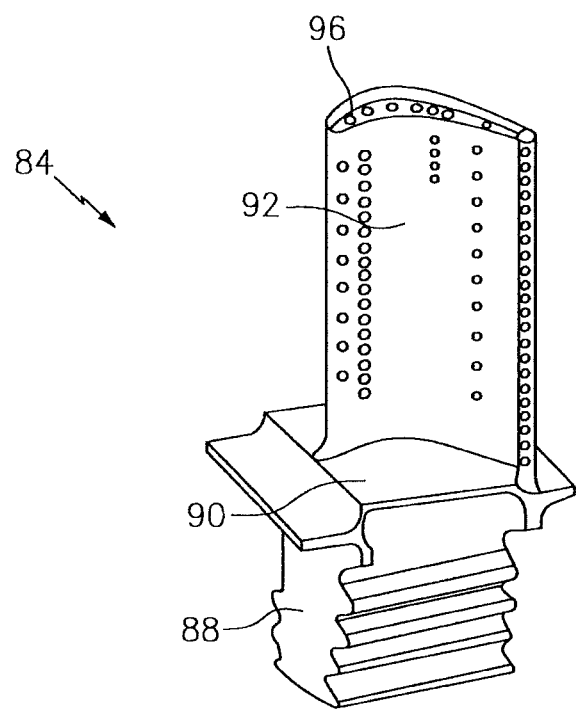
FIG. 4 is a perspective view of a turbine blade as an example component with internal passages.

The rotor assembly 66 includes an array of blades 84 circumferentially disposed around a disk 86. Each blade 84 includes a root 88, a platform 90 and an airfoil 92 (also shown in FIG. 4). A portion of each blade root 88 is received within a rim 94 of the disk 86. Each airfoil 92 extends radially outward, and has a tip 96 disposed in close proximity to a blade outer air seal (BOAS) assembly 62. Each BOAS segment 64 may include an abradable material to accommodate potential interaction with the rotating blade tips 96.

Figure 5:
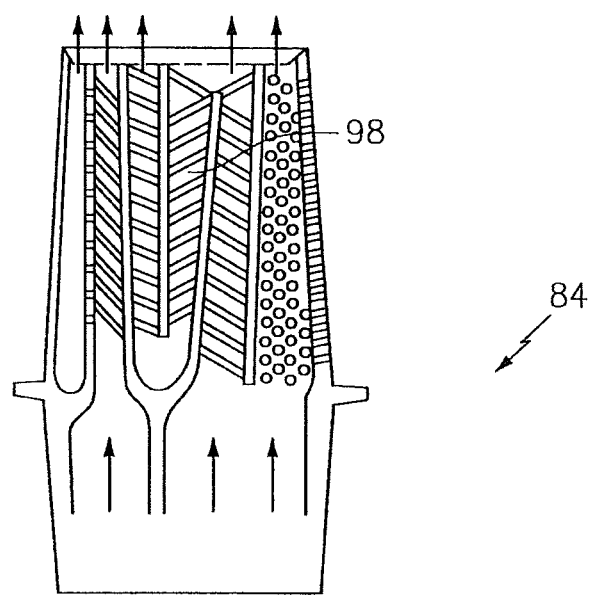
FIG. 5 is a schematic cross-section view of the showing the internal passages.

To resist the high temperature stress environment in the hot gas path of a turbine engine, each blade 84 may be formed to have a single crystal or columnar grain microstructure. It should be appreciated that although a blade 84 with internal passageways 98 (FIG. 5) will be described and illustrated in detail, other components including, but not limited to, vanes, fuel nozzles, airflow swirlers, combustor liners, turbine shrouds, vane endwalls, airfoil edges and other gas turbine engine components "W" may also be manufactured in accordance with the teachings herein.

The present disclosure involves the use of additive manufacturing techniques to form a component "W", as will be disclosed in the embodiments described below. In general terms, additive manufacturing techniques allow for the creation of a component "W" by building the component with successively added layers; e.g., layers of powdered material. The additive manufacturing process facilitates manufacture of relatively complex components, minimize assembly details and minimize multi-component construction. In the additive manufacturing process, one or more materials are deposited on a surface in a layer. In some instances, the layers are subsequently compacted. The material(s) of the layer may be subsequently unified using any one of a number of known processes (e.g., laser, electron beam, etc.). Typically, the deposition of the material (i.e. the geometry of the deposition later for each of the materials) is computer controlled using a three-dimensional computer aided design (CAD) model. The three-dimensional (3D) model is converted into a plurality of slices, with each slice defining a cross section of the component for a predetermined height (i.e. layer) of the 3D model. The additively manufactured component is then "grown" layer by layer; e.g., a layer of powdered material(s) is deposited and then unified, and then the process is repeated for the next layer. Examples of additive manufacturing processes that can be used with the present disclosure include, but are not limited to, Stereolithography (SLS), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Direct Metal Laser Sintering (DMLS) and others. The present disclosure is not limited to using any particular type of additive manufacturing process.

Figure 6:
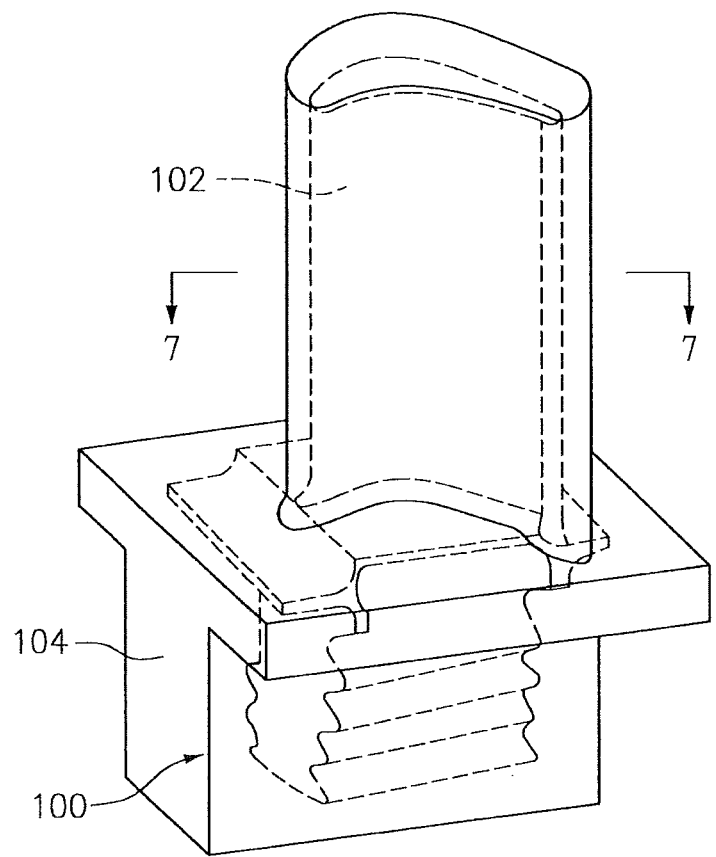
FIG. 6 illustrates a crucible in accordance with aspects of this disclosure.
Figure 7:
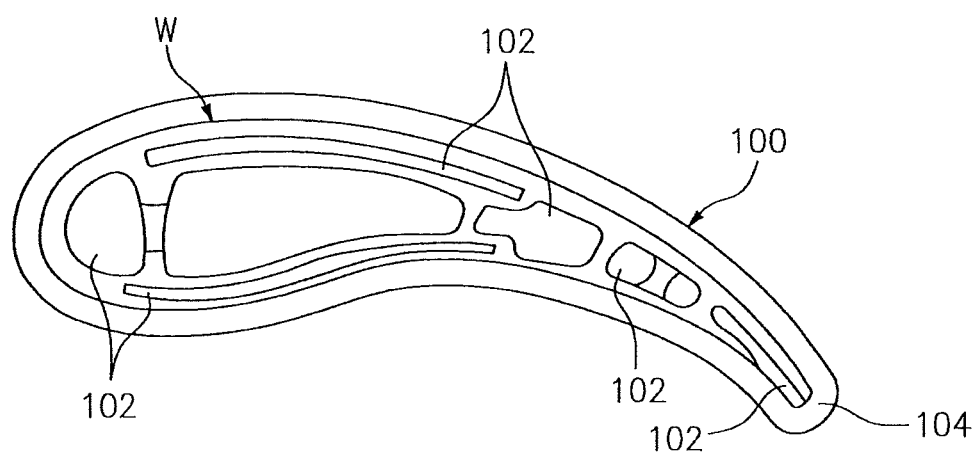
FIG. 7 is a schematic lateral cross-section view of the example component with internal passages within the crucible.

In the embodiments described below, an additive manufacturing process is utilized to form a crucible 100 (FIG. 6) and a component "W" 84 (e.g., a blade, a vane, etc.). With reference to FIG. 6, the additive manufactured crucible 100 generally includes a core 102 and a shell 104. The shell 104 and the core 102 define the geometry of the component "W" (e.g., including complex exterior and interior geometries of the component "W"), and provide a support structure for the component "W". The shell 104 fauns a structure having surfaces that will define the outer surfaces of the component "W". The core 102 forms bodies that occupy volumes that will be voids (e.g., internal passages) within the final component "W". The crucible 100 may comprise a variety of different material types; e.g., refractory metals, ceramics, combinations thereof, etc. As will be explained below, the crucible 100 may be utilized as a melting unit and/or a die during processing of the component "W".

Figure 8:
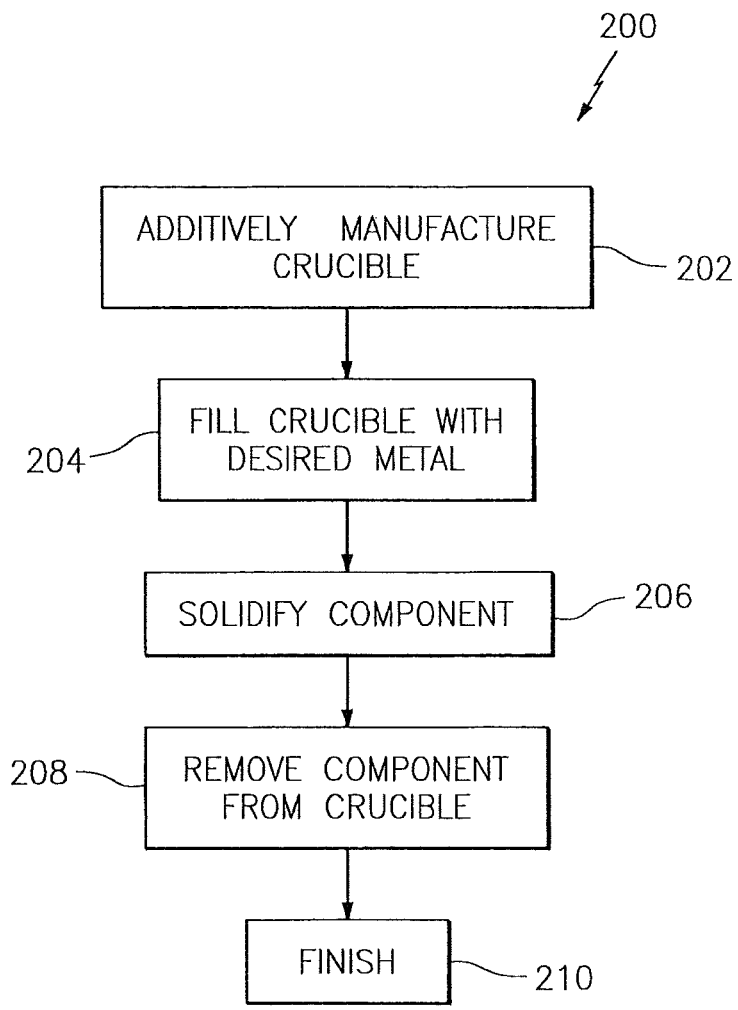
FIG. 8 is a flow chart of one disclosed non-limiting embodiment of a method for fabricating an example component with internal passages.

With reference to FIG. 8, according to one disclosed non-limiting embodiment for forming single crystal or columnar grain superalloy component with internal passageways, a method includes forming a crucible 100. The crucible 100 is additively manufactured (Step 202). It should be appreciated that the core 102 and/or shell 104 of the crucible 100 may be additively manufactured from materials that include, but are not limited to, ceramic material such as silica, alumina, zircon, cobalt, mullite, kaolin, refractory metals, combinations thereof, etc.

Following additive manufacture, the crucible 100 may be dried and fired (i.e. bisqued) at an intermediate temperature before high firing to fully sinter and densification. The additively manufactured crucible 100 thereby forms a cavity for forming the component W. That is, the crucible 100 is integrally formed by the additive manufacturing process such that the conventional separate manufacture of the core and shell are essentially combined into a single step. It should be appreciated that single or multiple molds and cavities may be additively manufactured and assembled.

The crucible 100 may then be filled with a component material such as a desired metal (Step 204). Non-limiting examples of metal component materials include superalloys; e.g., nickel based superalloys, cobalt based superalloys, iron based superalloys, combinations thereof, etc. In some instances, the component material added to the crucible 100 may be in powder form that can be subsequently melted. In other instances, the component material added to the crucible 100 may be in molten form that is subsequently solidified. The present disclosure is not limited, however, to adding component material in any particular form.

In some instances, the crucible is combined or utilized with structure (e.g., a starter seed and a chill plate) operable to cause the component W to be formed having a directionally solidified microstructure (i.e., a "DS" microstructure), such as a single crystal microstructure or a columnar grain microstructure. A single crystal solid (sometimes referred to as a "monocrystalline solid") component is one in which the crystal lattice of the substantially all of the component material is continuous and unbroken to the edges of the component, with virtually no grain boundaries. Processes for growing a single crystal alloy structure are believed to be known to those of ordinary skill in the art, and therefore descriptions of such processes are not necessary here for enablement purposes. However, an example is provided hereinafter to facilitate understanding of the present disclosure. A portion of a metallic starter seed may extend into a vertically lower portion of the component material receiving portion of the crucible 100. During subsequent processing of the component "W", molten component material contacts the starter seed and causes the partial melt back thereof. The component material is subsequently solidified by a thermal gradient moving vertically through the crucible 100; e.g., the component is solidified epitaxially from the unmelted portion of the starter seed to form the single crystal component. The thermal gradient used to solidify the component may be produced by a combination of mold heating and mold cooling; e.g., using a mold heater, a mold cooling cone, a chill plate and withdrawal of the component being formed. As indicated above, the aforesaid description is an example of how a single crystal microstructure component may be formed, and the present disclosure is not limited thereto.

Now referring again to the embodiment described in FIG. 8, a single crystal starter seed or grain selector may be utilized to enable the component "W" to possess a single crystal microstructure (or other DS microstructure) during solidification (Step 206). The solidification may utilize a chill block in a directional solidification furnace. The directional solidification furnace has a hot zone that may be induction heated and a cold zone separated by an isolation valve. The chill block and additively manufactured crucible 100 may be elevated into the hot zone and filled with molten super alloy. After the pour, or being molten, the chill plate may descend into the cold zone causing a solid/liquid interface to advance from the partially molten starter seed, creating the desired single crystal microstructure (or other DS microstructure type) as the solid/liquid interface advances away from the starter seed. The formation process may be performed within an inert atmosphere or vacuum to preserve the purity of the component material being formed.

Following solidification, the additively manufactured crucible 100 may be removed from the solidified component "W" by various techniques (e.g., caustic leaching), thereby leaving behind the finished single crystal component (Step 208). After removal, the component W may be further finished such as by machining, threading, surface treating, coating or any other desirable finishing operation (Step 210).

Figure 9:
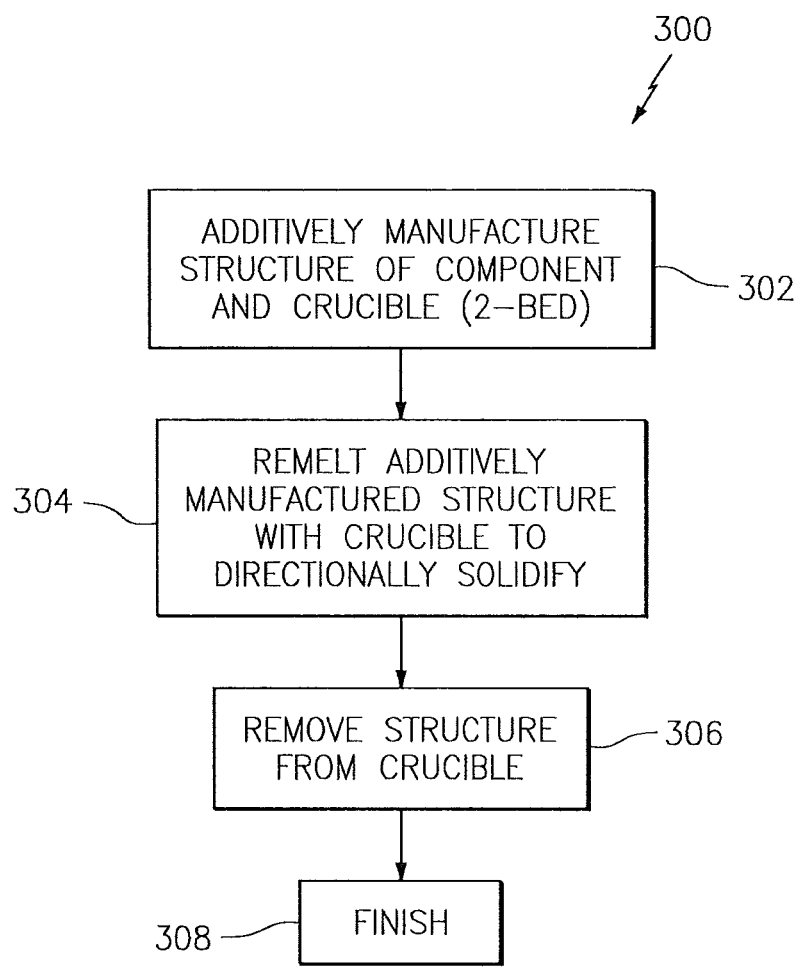
FIG. 9 is a flow chart of another disclosed non-limiting embodiment of a method for fabricating an example component with internal passages.
Figure 10:
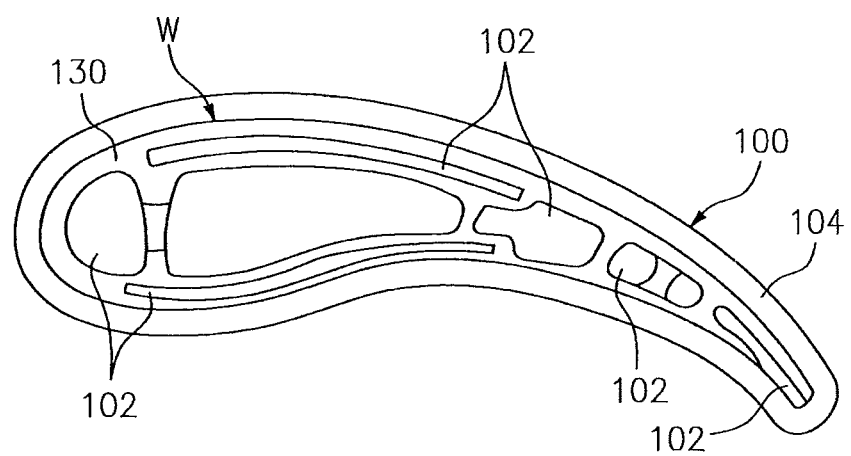
FIG. 10 is a lateral cross-section view of an example component with internal passages within a crucible as manufactured by the method of FIG. 9.

Now referring to FIGS. 9 and 10, in another non-limiting embodiment a method 300 includes additively manufacturing a component "W" (e.g. a turbine blade, vane, etc.) having internal cooling passages (Step 302) and a crucible 100. In this embodiment, the component "W" and the crucible 100 are additively manufactured using a multi-feedstock process such as a two-powder bed system. A structure 130 of the component W is manufactured of the desired superalloy, while the core 102 and shell 104 of the crucible 100 are manufactured of a different material such as a ceramic, a refractory metal, or other material which is later removed (FIG. 10). With respect to the internal cooling passages of the component "W", during the additive manufacturing process, a ceramic material, a refractory metal material, or other core 102 material is formed at the locations within the layers of the additively formed structure to coincide with the locations of the voids that will form the passages within the component. The core 102 within the component structure 130 and the shell 104 that surrounds the component structure 130 are later removed; e.g., in a manner as described above.

The structure 130 of the component W, being additively manufactured, may be a polycrystalline superalloy. As indicated above, it may be desirable for the component structure 130 to have a single crystal microstructure (or other DS microstructure) that is better suited to withstand the high temperature, high stress operating environment of the gas turbine engine.

To thereby facilitate formation of a component having a single crystal microstructure (or other DS microstructure), the additively manufactured superalloy structure 130 is re-melted within the crucible 100 (Step 304). For example, the additively manufactured superalloy structure 130 may be re-melted and directionally solidified (e.g., as described above) to form a metal single crystal structure (or other DS microstructure) within the crucible 100. As indicated above, the present disclosure is not limited to any particular technique for creating the single crystal microstructure.

Following solidification, the additively manufactured crucible 100 may be removed from the solidified component W such as by caustic leaching, to leave the finished single crystal component (Step 306). After removal, the component W may be further finished such as by machining, threading, surface treating, coating or any other desirable finishing operation (Step 308).

Figure 11:
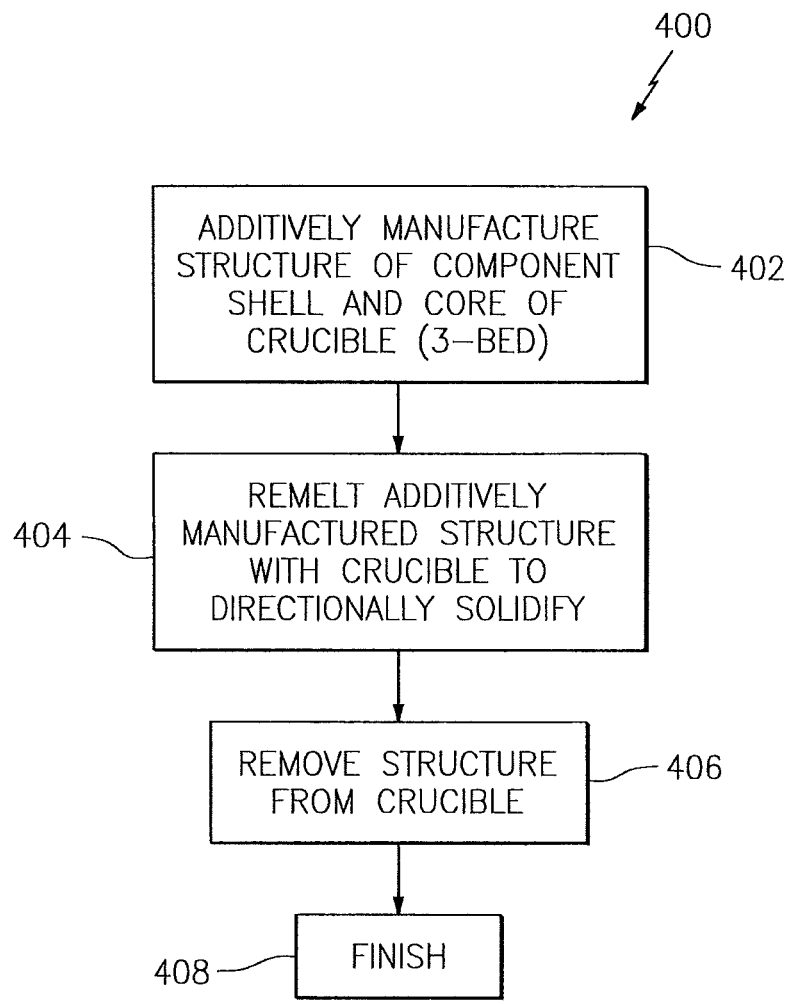
FIG. 11 is a flow chart of another disclosed non-limiting embodiment of a method for fabricating an example component with internal passages.
Figure 12:
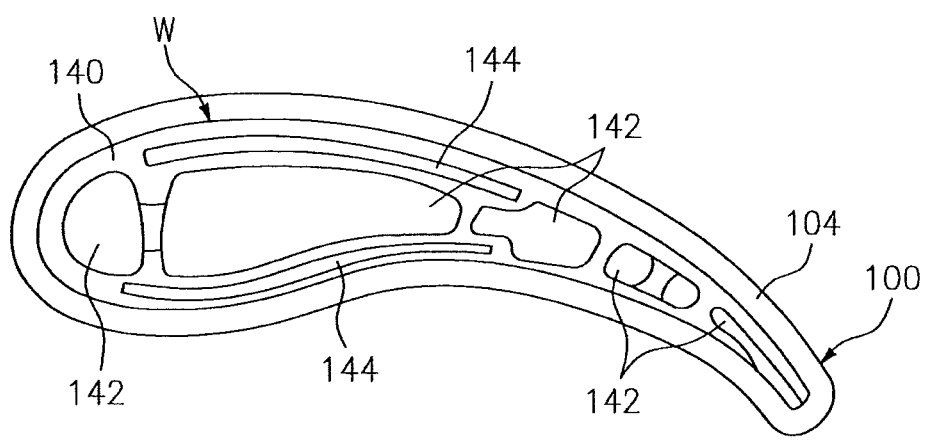
FIG. 12 is a lateral cross-section view of an example component with internal passages within a crucible as manufactured by the method of FIG. 11.

Now referring to FIGS. 11 and 12, a method 400 according to another non-limiting embodiment includes additively manufacturing component "W" with a multi-feedstock additive manufacturing process such as three-powder bed system (Step 402). The component "W" 140 is manufactured of the desired superalloy while the core 102 and shell 104 of the crucible 100 are manufactured of a different material (FIG. 12). Locations for the internal cooling passages 142 of the component "W" are additively manufactured of ceramic material and locations for microcircuits 144 of the component "W" are additively manufactured of a refractory metal material. The microcircuit 144 is relatively smaller than, and may be located outboard of, the internal cooling passages 142 to facilitate tailorable, high efficiency convective cooling. The bodies formed to create the microcircuits may be formed of refractory metals (e.g., molybdenum (Mo), Tungsten (W), etc.) that possess relatively high ductility for formation into complex shapes and have melting points that are in excess of typical casting temperatures of nickel based superalloys. Refractory metals of this type can be removed by various know techniques (e.g., chemical removal, thermal leeching, oxidation methods, etc.) to leave behind a cavity forming the microcircuit 144.

As described above, to facilitate formation of a component having a single crystal microstructure (or other DS microstructure), the additively manufactured component 140 is re-melted within the crucible 100 (Step 404) &limed in step 402, and subjected to processes for creating the single crystal microstructure (or other DS microstructure type) within the component 140. As indicated above, the present disclosure is not limited to any particular technique for creating the single crystal microstructure.

Following solidification, the additively manufactured crucible 100 may be removed from the solidified component W such as by caustic leaching, to leave the finished single crystal component "W" 140 (Step 406). After removal, the component "W" may be further finished such as by machining, threading, surface treating, coating or any other desirable finishing operation (Step 408).

Figure 13:
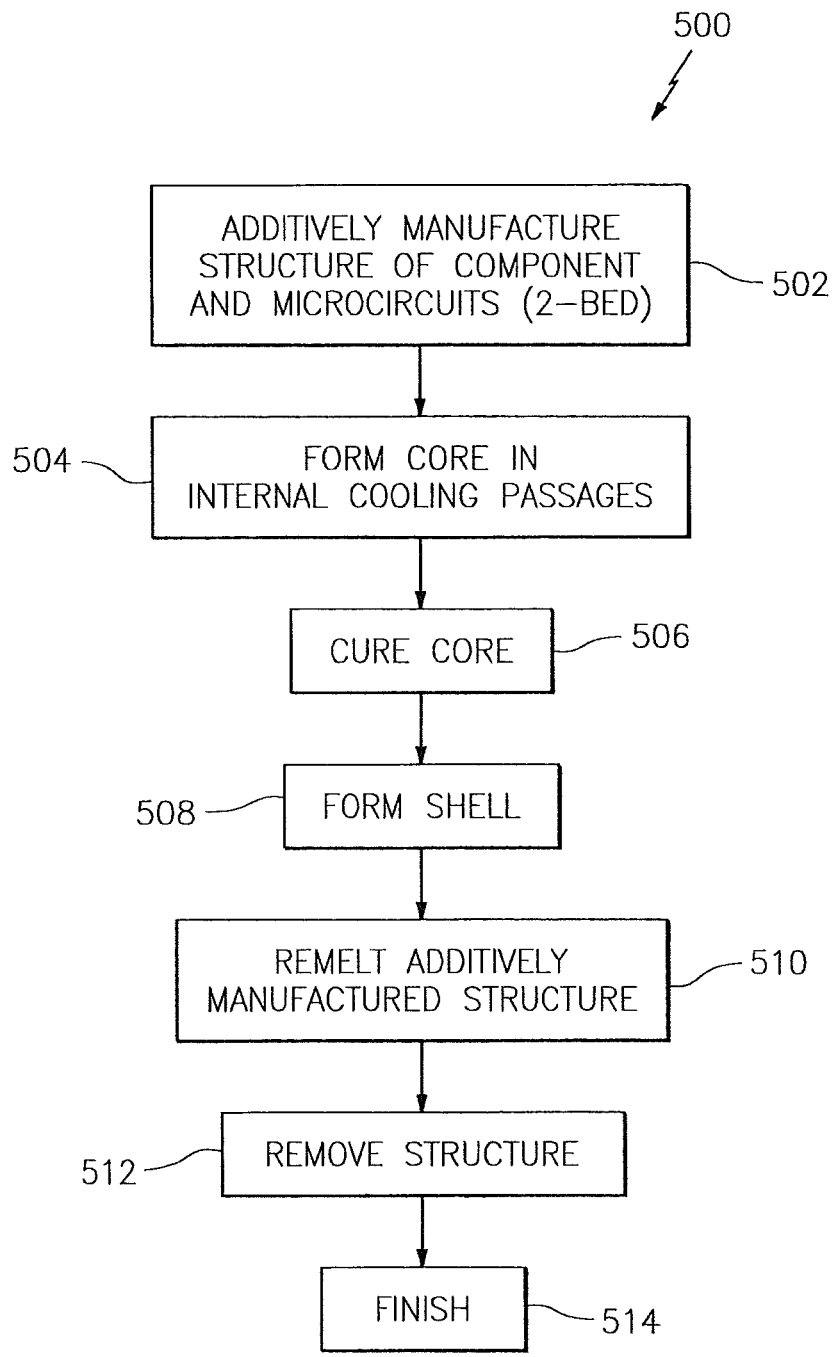
FIG. 13 is a flow chart of another disclosed non-limiting embodiment of a method for fabricating an example component with internal passages.
Figure 14:
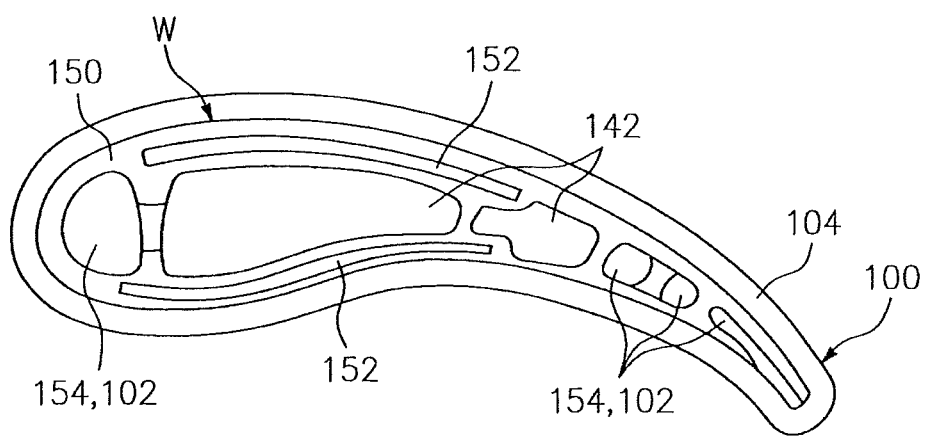
FIG. 14 is a lateral cross-section view of an example component with internal passages within a crucible as manufactured by the method of FIG. 13.

Now referring to FIGS. 13 and 14, a method 500 according to another disclosed non-limiting embodiment includes additively manufacturing component "W" with a multi-feedstock additive manufacturing process such as two-powder bed system (Step 502). The component "W" 150 is manufactured of the desired superalloy while microcircuits 152 of the component "W" are additively manufactured of a refractory metal material. That is, the refractory metal material is additively manufactured within the structure 150 where the microcircuits 152 will be located.

In this embodiment, the internal cooling passages 154 of the component W may be filled with a ceramic slurry to form the core 102 (Step 504). The slurry may include, but is not limited to, ceramic materials commonly used as core materials including, but not limited to, silica, alumina, zircon, cobalt, mullite, and kaolin. In the next step, the ceramic core may be cured in situ by a suitable thermal process if necessary (Step 506).

Next, a ceramic shell may then be formed over the component 150 and internal ceramic core (Step 508). The ceramic shell may be formed over the component 150 and ceramic core by dipping it into ceramic powder and binder slurry to form a layer of ceramic material covering the component 150. The slurry layer is dried and the process repeated for as many times as necessary to form a green (i.e.

unfired) ceramic shell mold. The thickness of the green ceramic shell mold at this step may be from about 0.2-1.3 inches (5-32 mm). The green shell mold may then be bisque fired at an intermediate temperature to partially sinter the ceramic and burn off the binder material. The mold may then be high fired at a temperature between about 1200° F. (649° C.) to about 1800° F. (982° C.) from about 10 to about 120 minutes to sinter the ceramic to full density to form the shell mold.

As described above, to facilitate formation of a component having a single crystal microstructure (or other DS microstructure), the additively manufactured component is re-melted within the crucible 100 (Step 510), and subjected to processes for creating the single crystal microstructure (or other DS microstructure type) within the component 150. As indicated above, the present disclosure is not limited to any particular technique for creating the single crystal microstructure.

Following solidification, the additively manufactured crucible 100 may be removed from the solidified component W such as by caustic leaching, to leave the finished single crystal component "W" 150 (Step 512). After removal, the component "W" may be further finished such as by machining, threading, surface treating, coating or any other desirable finishing operation (Step 514).

Figure 15:
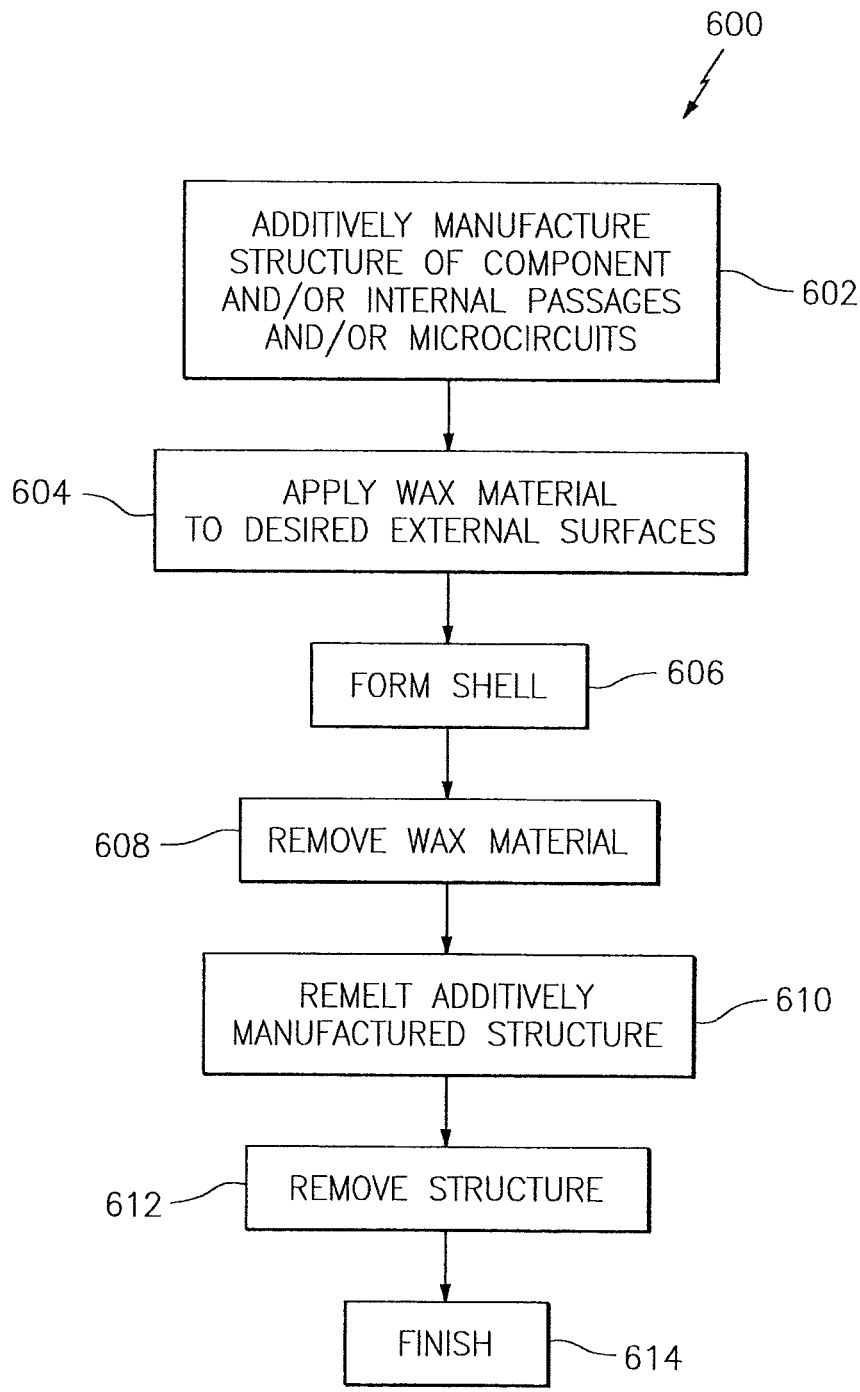
FIG. 15 is a flow chart of another disclosed non-limiting embodiment of a method for fabricating an example component with internal passages.
Figure 16:
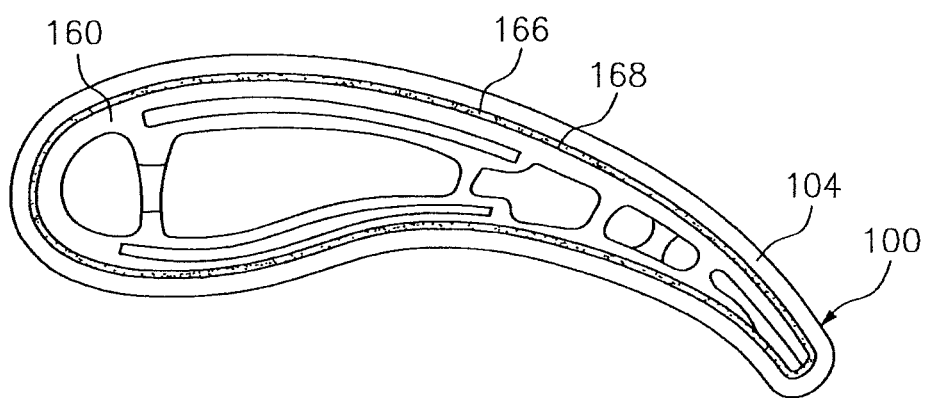
FIG. 16 is a lateral cross-section view of an example component with internal passages within a crucible and coated with a wax layer as manufactured by the method of FIG. 15.

Now referring to FIGS. 15 and 16, a method 600 according to another disclosed non-limiting embodiment facilitates a high quality surface finish. As described above, the component "W" is additively manufactured of a desired superalloy that itself forms the cavity pattern for the crucible. The additively manufactured component "W" is then re-melted within the crucible to facilitate formation of the single crystal microstructure. However, the crucible, being formed by the additive manufactured structure, may have a relatively poor surface finish typically not acceptable for use as a blade or vane in the gas turbine engine. That is, the airfoil surfaces of the blade and vanes in the gas turbine engine necessarily require particular contour tolerances and surface finishes that are typically not achieved by direct additive manufacture or may not be achieved in an additive manufacturing process within a reasonable cycle time.

To further improve the finish of an exterior surface of a component "W" 160 (additively manufactured according to any of the above-described embodiments), a relatively thin layer of a wax material 166 may be applied to an external, aerodynamic surface 168 (e.g. an airfoil surface) of the component 160 (Step 604; FIG. 16). The wax material provides a smoother surface finish than the relatively rough surface of an additively manufactured component 160.

Next, a ceramic shell 104 is formed over the structure 160 (Step 606). The ceramic shell may be formed over the additively manufactured structure 160 by dipping or other process.

The relatively thin layer of a wax material 166 is subsequently removed (Step 608). The relatively thin layer of a wax material 166 may be removed by heating or other operation that but does not otherwise effect the additively manufactured structure 160.

Then, as described above, to facilitate formation of the single crystal microstructure (or other DS microstructure), the additively manufactured superalloy structure 160 is re-melted within the shell of the crucible (Step 610), and subjected to processes for creating the single crystal microstructure (or other DS microstructure type) within the component 150. As indicated above, the present disclosure is not limited to any particular technique for creating the single crystal microstructure. It should be further appreciated that the re-melting (Step 610) may alternatively be combined with the removal of the relatively thin layer of a wax material 166 (Step 608).

Following solidification, the solidified component W may be removed from the crucible by caustic leaching, to leave the finished single crystal structure 160 of the component W (Step 612). After removal, the component W may be further finished such as by machining, threading, surface treating, coating or any other desirable finishing operation (Step 614).

The method disclosed herein facilitates the relatively rapid additive manufacture of single crystal microstructure (or other DS microstructure type; e.g., columnar grain) components with complex internal passages and heretofore unavailable surface finishes to withstand the high temperature, high stress operating environment of a gas turbine engine environment.

It should be understood that relative positional terms such as "forward," "aft," "upper," "lower," "above," "below," and the like are with reference to the normal operational attitude of the vehicle and should not be considered otherwise limiting.

It should be understood that like reference numerals identify corresponding or similar elements throughout the several drawings. It should also be understood that although a particular component arrangement is disclosed in the illustrated embodiment, other arrangements will benefit here from.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A method of manufacturing a component, comprising:
additively manufacturing a crucible for casting of the component, wherein the crucible includes a core and a shell;
adding metal material in powder form to the crucible, wherein the metal material is a superalloy;
solidifying the metal material within the crucible to form a metal directionally solidified microstructure within the component; and
removing the crucible to reveal the component;
wherein the method further comprises:
manufacturing the core and the shell of a material that is different from the metal material;
additively manufacturing internal cooling passages of the component using a ceramic material;
additively manufacturing locations for microcircuits of the component using a refractory metal material, wherein the microcircuits are smaller than and located outboard of the internal cooling passages;
filling the internal cooling passages with a ceramic slurry to form the core; and
curing the core.

2. The method as recited in claim 1, further comprising:
   forming the shell over the component and the core by dipping the component into a ceramic powder and binder slurry to form a layer of ceramic material covering the component.

* * * * *